United States Patent
Al-Amoody et al.

(10) Patent No.: US 10,790,198 B2
(45) Date of Patent: Sep. 29, 2020

(54) FIN STRUCTURES

(71) Applicant: GLOBALFOUNDRIES INC., Grand Cayman (KY)

(72) Inventors: Fuad H. Al-Amoody, Rexford, NY (US); Yiheng Xu, Clifton Park, NY (US); Rishikesh Krishnan, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/058,494

(22) Filed: Aug. 8, 2018

(65) Prior Publication Data
US 2020/0051867 A1 Feb. 13, 2020

(51) Int. Cl.
*H01L 29/06* (2006.01)
*H01L 21/8234* (2006.01)
*H01L 21/762* (2006.01)
*H01L 21/02* (2006.01)

(52) U.S. Cl.
CPC ........ *H01L 21/823481* (2013.01); *H01L 21/823431* (2013.01); *H01L 21/02164* (2013.01); *H01L 21/02318* (2013.01); *H01L 21/76202* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 7,354,812 B2 | 4/2008 | Batra et al. | |
| 8,338,305 B2 | 12/2012 | Chen et al. | |
| 9,245,979 B2 | 1/2016 | Cai et al. | |
| 9,882,029 B2 | 1/2018 | Huang et al. | |
| 9,893,185 B2 | 2/2018 | Wu et al. | |
| 10,121,882 B1 * | 11/2018 | Ho | H01L 29/0649 |

* cited by examiner

*Primary Examiner* — Hung K Vu
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to fin structures and methods of manufacture. The structure includes: a plurality of fin structures formed of substrate material; a semiconductor material located between selected fin structures of the plurality of fin structures; and isolation regions within spaces between the plurality of fin structures.

10 Claims, 4 Drawing Sheets

FIN STRUCTURES

FIELD OF THE INVENTION

The present disclosure relates to semiconductor structures and, more particularly, to fin structures and methods of manufacture.

BACKGROUND

FinFET technologies include fins composed of substrate material. Fin bending, though, has long been an issue in FinFET technologies. Part of the fin bending is caused by the force generated during the curing of shallow trench isolation regions, which results in a shrinking of the material and pulling the fins outwards. The impact of fin bending becomes worse with each shrinking technology node, impacting device performance. For example, due to the bending of the fin, the devices can have different Vt shifts or other device variations.

SUMMARY

In an aspect of the disclosure, a structure comprises: a plurality of fin structures formed of substrate material; a semiconductor material located between selected fin structures of the plurality of fin structures; and isolation regions within spaces between the plurality of fin structures.

In an aspect of the disclosure, a method comprises: forming a plurality of fin structures; forming an insulator liner over the plurality of fin structures; depositing a conformally thick semiconductor material over and between the plurality of fin structures; etching the semiconductor material to a predetermined thickness; depositing insulator material over the etched semiconductor material; annealing the insulator material; and recessing the insulator material.

In an aspect of the disclosure, a method comprises: forming a plurality of fin structures from substrate material by etching first and second trenches in the substrate material to a first depth, wherein each of the second trenches has a width greater than any of the first trenches; forming a conformal dielectric layer on the substrate material and on the plurality of fin structures; depositing conformal semiconductor material to fill the first trenches and lining the second trenches; and forming fin isolation regions within the first trenches and the second trenches.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to fin structures and methods of manufacture. More specifically, the present disclosure is related to FinFET technologies with fins having reduced or no bending. Advantageously, by implementing the processes described herein, it is now possible to reduce fin bending which, in turn, improves device performance. The processes described herein will reduce device variations and is easily integrated with current processes of record.

In embodiments, the method of reducing fin bending comprises forming a plurality of fin structures with a liner of insulator material (e.g., oxide). The method further comprises depositing a conformal semiconductor material on the fin structures. In embodiments, the semiconductor material can be Si material. The semiconductor material is etched to a desired thickness using a non-conformal etching process to maintain a certain desired thickness between selected adjacent fin structures. To form the STI regions, an insulator material is deposited over the semiconductor material and between the plurality of fin structures, followed by curing and annealing processes. The insulator material is then recessed to form the STI regions.

In alternative embodiments, the method of reducing fin bending comprises: forming fins by etching first and second trenches in a substrate to a first depth, wherein each of the second trenches has a width greater than any of the first trenches; forming a conformal dielectric layer on the substrate; depositing a conformal semiconductor layer on the substrate to fill the first trenches without filling the second trenches; and forming fin isolation by depositing, annealing and recessing dielectric material.

The fin structures and related features of the present disclosure can be manufactured in a number of ways using a number of different tools. In general, though, the methodologies and tools are used to form structures with dimensions in the micrometer and nanometer scale. The methodologies, i.e., technologies, employed to manufacture the fin structures and related features of the present disclosure have been adopted from integrated circuit (IC) technology. For example, the structures are built on wafers and are realized in films of material patterned by photolithographic processes on the top of a wafer. In particular, the fabrication of the fin structures and related features uses three basic building blocks: (i) deposition of thin films of material on a substrate, (ii) applying a patterned mask on top of the films by photolithographic imaging, and (iii) etching the films selectively to the mask.

Figure 1:
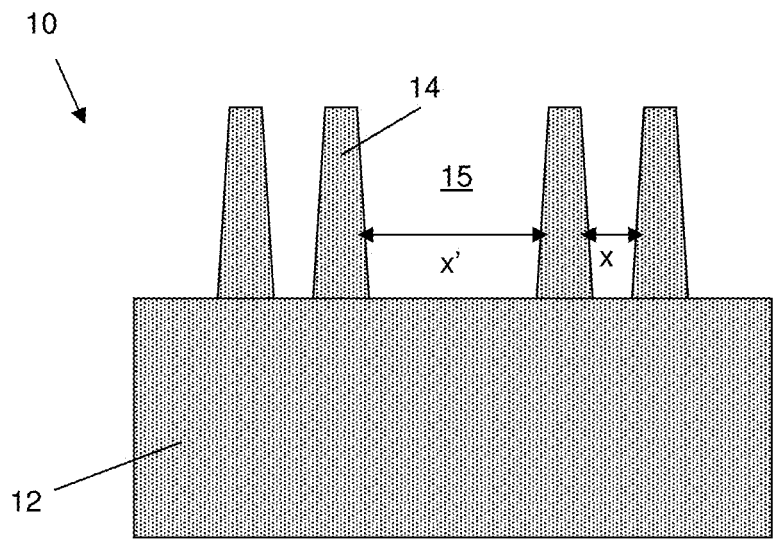
FIG. 1 shows a plurality of fin structures and respective fabrication processes in accordance with aspects of the present disclosure.

FIG. 1 shows a plurality of fin structures and respective fabrication processes in accordance with aspects of the present disclosure. More specifically, the structure 10 of FIG. 1 includes a substrate 12. In embodiments, the substrate 12 may be composed of any suitable material including, but not limited to, Si, SiGe, SiGeC, SiC, GaAs, InAs, InP, and other III/V or II/VI compound semiconductors. In embodiments, the substrate 12 can be a bulk substrate or semiconductor on insulator (SOI) technologies.

A plurality of fins 14 are formed from the substrate 12 using conventional lithography and etching processes, e.g., reactive ion etching. In embodiments, the plurality of fins 14 can be trapezoidal in shape; although other shapes, e.g., rectangles, are also contemplated herein. In the fabrication process, for example, a resist formed over the substrate 12 is exposed to energy (light) to form a pattern (opening). An etching process with a selective chemistry, e.g., reactive ion etching (RIE), will be used to form one or more trenches 15 in the substrate 12 through the openings of the resist. The resist can then be removed by a conventional oxygen ashing process or other known stripants.

In these processes, the trenches 15 are formed in the substrate 12 to a predetermined depth, e.g., 150 nm, wherein each of the trenches 15 include a spacing "x", "x'". In embodiments, the spacing "x'" has a width greater than the spaces "x". In embodiments, the spacing "x'" between adjacent fin structures 14 allows for a conformal etching process of material that will line the sidewalls of the plurality of trenches 15, e.g., line the trenches 15 and fin structures 14; whereas, the spacing "x" between adjacent trenches will only permit a non-conformal etching process of the material that fills the trenches 15. In more specific embodiments, the spacing "x" can be about 15 nm; whereas, the spacing "x'" is greater than 15 nm.

In alternative embodiments, the plurality fin structures 14 can be fabricated using a sidewall image transfer (SIT) technique. In the SIT technique, for example, a mandrel is formed on the substrate 12, using conventional deposition, lithography and etching processes. For example, in an example of a SIT technique, a mandrel material, e.g., $SiO_2$, is deposited on the substrate 12 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 14. Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures 14 can also be formed during this or other patterning processes, or through other conventional patterning processes, as contemplated by the present disclosure.

Figure 2:
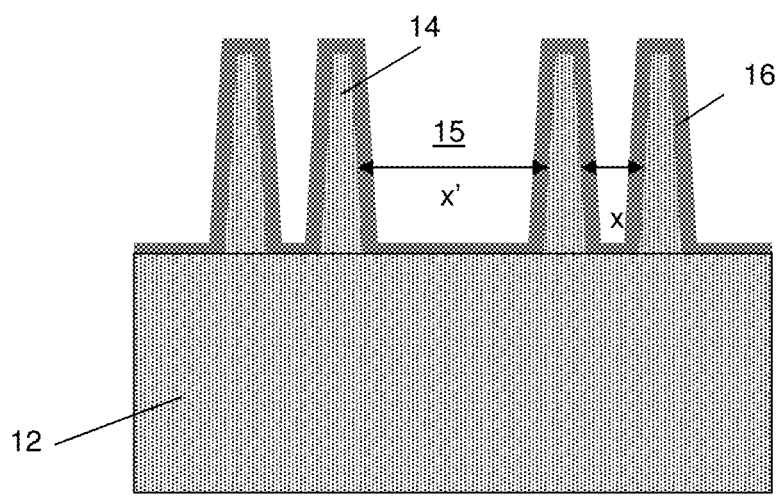
FIG. 2 shows a dielectric liner on the plurality of fin structures and respective fabrication processes in accordance with aspects of the present disclosure.

FIG. 2 shows a dielectric liner 16 deposited on the plurality of fin structures 14. In embodiments, the dielectric liner 16 is a conformal layer of oxide material grown on the plurality of fin structures 14 using conventional growth processes. For example, the dielectric liner 16 can be grown using an in-situ steam generation process. In embodiments, the dielectric liner 16 can have a thickness of about 10 Å to about 20 Å; although other dimensions are also contemplated herein. For example, the thickness of the dielectric liner 16 is less than the spacing "x" between the plurality of adjacent fin structures 14. It should also be understood by those of skill in the art that the oxide material is not conventionally used for a crystalline seed layer.

Figure 3:
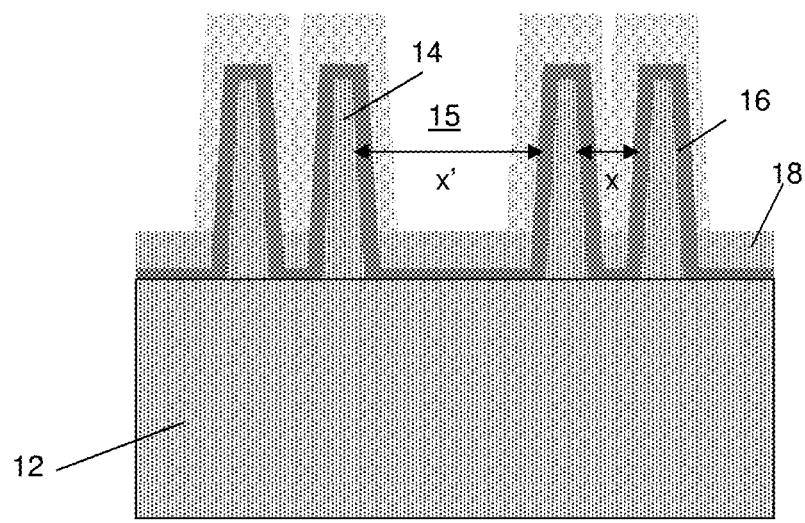
FIG. 3 shows a layer of semiconductor material on the dielectric liner and respective fabrication processes in accordance with aspects of the present disclosure.

FIG. 3 shows a layer of semiconductor material 18 on the dielectric liner 16 and respective fabrication processes in accordance with aspects of the present disclosure. In embodiments, the semiconductor material 18 can be Si material. In alternative embodiments, the semiconductor material 18 is any material that can be consumed during subsequent fabrication processes, e.g., annealing processes of oxide material. For example, the semiconductor material 18 can be any of the same materials of the substrate 12.

Still referring to FIG. 3, the semiconductor material 18 is conformally deposited to a desired thickness on the dielectric liner 16, e.g., over and between the plurality of fin structures 14. For example, in embodiments, the semiconductor material 18 can be deposited by a chemical vapor deposition (CVD) or other conventional deposition process to a thickness of approximately 25 Å or greater over and between the plurality of fin structures 14; although other dimensions are contemplated herein. By way of more specific example, the semiconductor material 18 substantially or completely fills the smaller spaces "x" and lines the trenches 15 with the larger spaces "x'", e.g., does not fill the spaces "x". In more specific embodiments, the semiconductor material 18 can be deposited to any thickness that will allow for a non-conformal etching process within the smaller spaces "x" between adjacent fin structures 14 (e.g., to a thickness that will not allow for complete consumption of the semiconductor material 18 during subsequent annealing processes); while permitting conformal etching of the semiconductor material 18 in the larger spaces "x'" (e.g., to a reduce a thickness of the semiconductor material 18 so it can be consumed during subsequent annealing processes).

Figure 4:
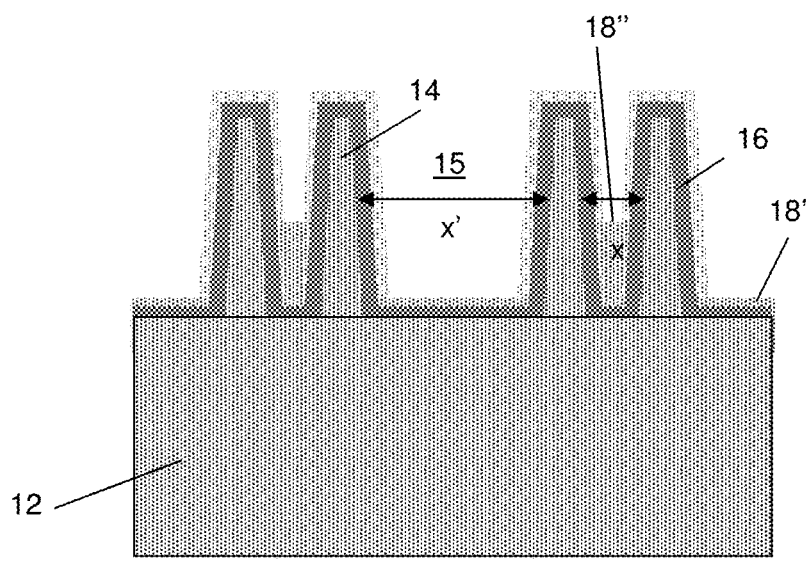
FIG. 4 shows an etching of the semiconductor material and respective structures in accordance with aspects of the present disclosure.

As shown in FIG. 4, the semiconductor material 18 is etched to reduce its thickness in certain regions, e.g., within the larger spaces "x'" between adjacent fin structures 14. In particular, the semiconductor material is conformally etched within the trenches 15 having the larger spaces "x'" and non-conformally etched within the trenches 15 having the smaller spaces "x". In this way, the thickness of the semiconductor material 18' within the larger spaces "x'" will be reduced greater than the thickness of the semiconductor material 18" within the smaller spaces "x". For example, the thickness of the semiconductor material 18' within the larger spaces "x'" can be about 20 Å to 25 Å or less, which will allow consumption of the semiconductor material 18' during subsequent annealing (e.g., wet and dry) processes; whereas, the semiconductor material 18" is at a thickness that will not allow consumption during the subsequent annealing processes. In one non-limiting illustrative example, the height of the semiconductor material 18" within the trenches 15 having spaces "x" can be about 30%-40% the height of the fin structures 14.

Figure 5:
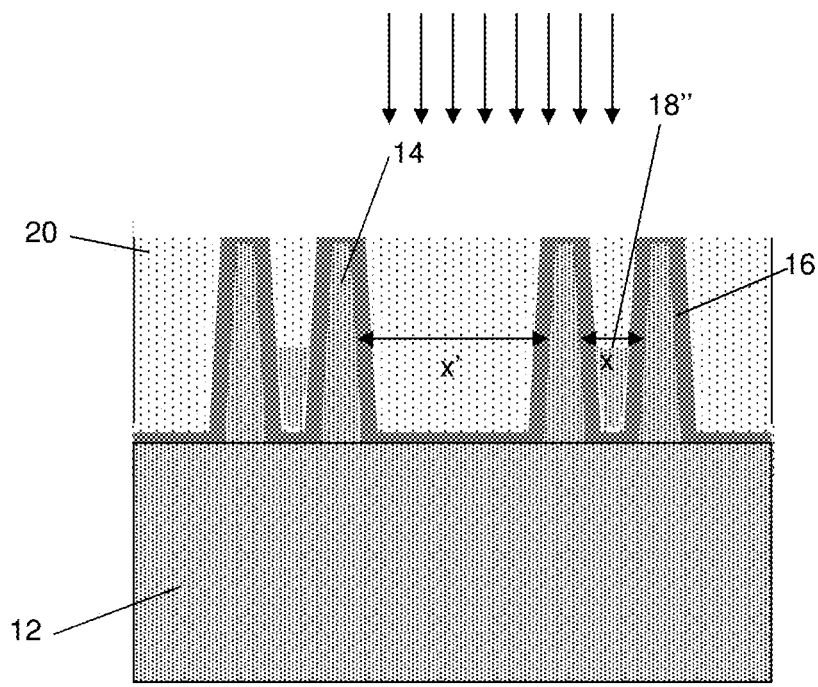
FIG. 5 shows isolation material between the plurality of fin structures, amongst other features, and respective structures in accordance with aspects of the present disclosure.

FIG. 5 shows isolation material 20 deposited between the plurality of fin structures 14, amongst other features. In embodiments, the isolation material 20 is insulator material, e.g., oxide. In more specific embodiments, the isolation material 20 is a flowable oxide material. The isolation material 20 undergoes a curing process known to those of skill in the art, followed by a chemical mechanical polishing (CMP) process and annealing process (represented by the arrows in FIG. 5). During the curing process, the plurality of fin structures 14 will not bend (e.g., remain vertically straight) due to the thickness of the semiconductor material 18" within the smaller spaces "x" on the sides of the plurality of fin structures 14. Also, during the annealing process, the semiconductor material 18' will be consumed by the isolation material 20, e.g., oxide. More specifically, when the thin film of Si, e.g., about 20 Å to 25 Å or less, is annealed in the presence of oxygen, the Si will be consumed, forming a layer of $SiO_2$.

Figure 6:
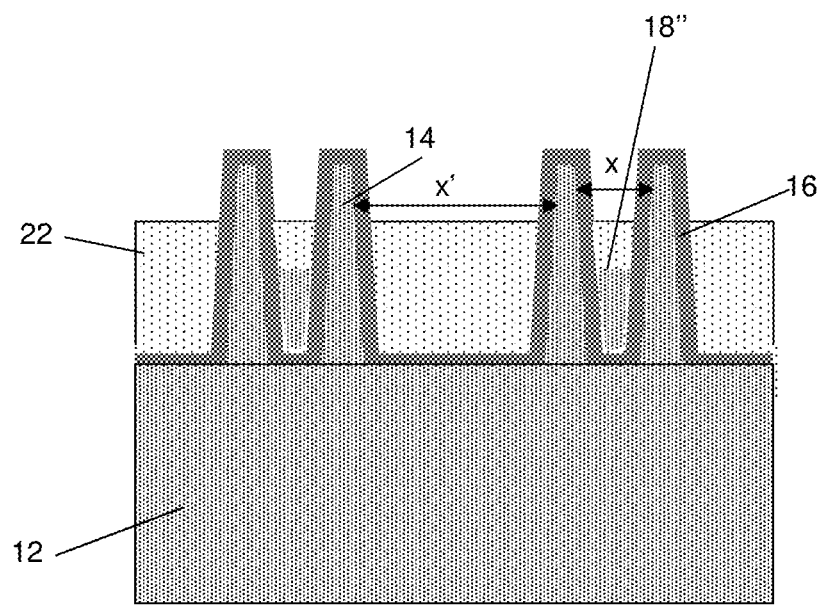
FIG. 6 shows recessed shallow trench isolation regions between the plurality of fin structures, amongst other features, and respective structures in accordance with aspects of the present disclosure.

In FIG. 6, the oxide layer 16 is recessed to form shallow trench isolation regions 22 between the plurality of fin structures 14. In embodiments, the oxide layer 16 can be recessed by a selective etching process, e.g., RIE. The oxide layer 16 should be at above the Si material 18" in the trenches 15 having spacing "x".

Figure 7:
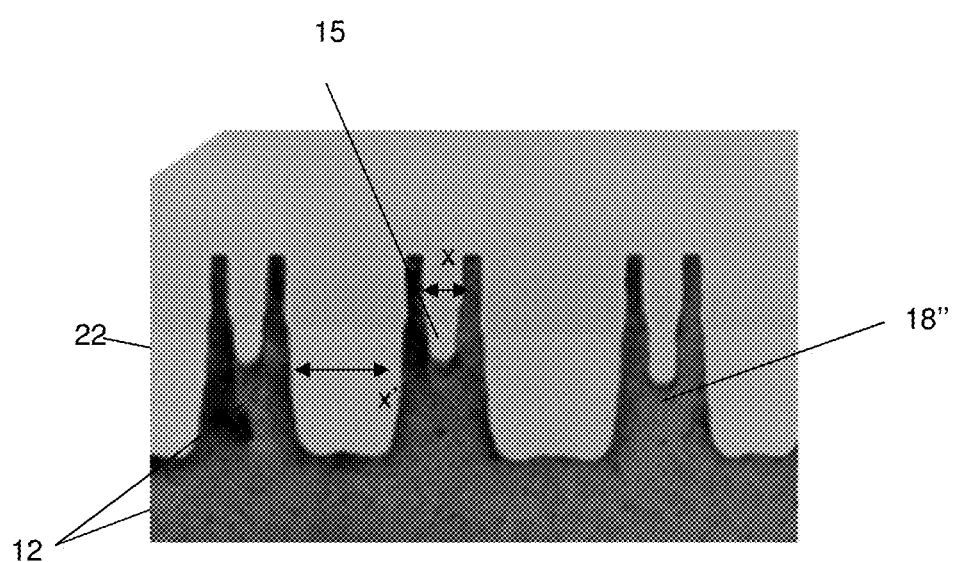
FIG. 7 shows a cross-sectional of the view of the fin structure using transmission electron microscopy (TEM).

FIG. 7 shows a cross sectional of the view of the fin structure using transmission electron microscopy (TEM). As noted in FIG. 6, an oxide layer is recessed to form shallow trench isolation regions 22 between the plurality of fin structures 14. In embodiments, the oxide layer can be recessed by a selective etching process, e.g., RIE. The oxide layer 16 should be at above the Si material 18" in the trenches 15 having spacing "x".

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a plurality of fin structures formed of substrate material;
a semiconductor material located between selected fin structures of the plurality of fin structures; and
isolation regions within spaces between the plurality of fin structures,
wherein the isolation regions are shallow trench isolation regions which are above the semiconductor material between the selected fin structures of the plurality of fin structures, wherein
the semiconductor material is non-consumed within selected spaces between the plurality of fin structures,
the selected spaces between the selected fin structures of the plurality of fin structures each have a width "x" which is smaller than spaces between remaining fin structures of the plurality of fin structures, and
the spaces between the remaining selected fin structures of the plurality of fin structures are devoid of the semiconductor material.

2. The structure of claim 1, further comprising an insulator liner covering the plurality of fin structures.

3. The structure of claim 2, wherein the insulator liner is oxide.

4. The structure of claim 1, wherein the semiconductor material is at a height lower than a height of the plurality of fin structures.

5. The structure of claim 1, wherein the semiconductor material is positioned to prevent bending of the plurality of fin structures.

6. The structure of claim 1, wherein the semiconductor material is Si.

7. A structure, comprising:
a plurality of fin structures;
a dielectric liner directly lining the plurality of fin structures;
semiconductor material on the dielectric liner between selected fin structures of the plurality of fin structures; and
shallow trench isolation regions above the semiconductor material between the selected fin structures of the plurality of fin structures and which are below a top surface of the plurality of fin structures, wherein
the semiconductor material is non-consumed within spaces between the selected fin structure of the plurality of fin structures, and
the spaces between the selected fin structures of the plurality of fin structures each have a width "x" which is smaller than spaces between other fin structures of the plurality of fin structures which do not have the semiconductor material therebetween.

8. The structure of claim 7, further comprising a layer of $SiO_2$ on the dielectric material between the selected fin structures and the other fin structures.

9. The structure of claim 7, wherein the shallow trench isolation regions are in direct contact with the semiconductor material and a dielectric material between the selected fin structures of the plurality of fin structures.

10. A structure, comprising:
a plurality of fin structures;
a dielectric liner directly lining the plurality of fin structures;
semiconductor material on the dielectric liner between selected fin structures of the plurality of fin structures; and
shallow trench isolation regions above the semiconductor material between the selected fin structures of the plurality of fin structures and which are below a top surface of the plurality of fin structures, wherein
the shallow trench isolation regions are in direct contact with the semiconductor material and a dielectric material between the selected fin structures of the plurality of fin structures, and
the shallow trench isolation regions are in direct contact with the dielectric material between the other of the plurality of fin structures which do not have the semiconductor material therebetween.

* * * * *